(12) United States Patent
Vallance et al.

(10) Patent No.: US 7,297,370 B2
(45) Date of Patent: Nov. 20, 2007

(54) CURABLE ENCAPSULANT COMPOSITION, DEVICE INCLUDING SAME, AND ASSOCIATED METHOD

(75) Inventors: Michael Alan Vallance, Albany, NY (US); John Robert Campbell, Clifton Park, NY (US); Kenneth Paul Zarnoch, Scotia, NY (US); Prameela Susarla, Clifton Park, NY (US); Bryan Patrick Duffey, Ballston Spa, NY (US); Gary William Yeager, Rexford, NY (US); Michael Joseph O'Brien, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 237 days.

(21) Appl. No.: 11/167,843

(22) Filed: Jun. 24, 2005

(65) Prior Publication Data
US 2006/0135705 A1 Jun. 22, 2006

Related U.S. Application Data

(63) Continuation-in-part of application No. 11/022,904, filed on Dec. 22, 2004.

(51) Int. Cl.
*B05D 3/02* (2006.01)
(52) U.S. Cl. ............... 427/372.2; 427/96.2; 427/99.2; 427/99.4; 427/385.5; 525/391; 525/426; 525/445; 525/468
(58) Field of Classification Search ............... None
See application file for complete search history.

(56) References Cited

U.S. PATENT DOCUMENTS

| 4,632,798 | A | | 12/1986 | Eickman et al. |
| 4,785,057 | A | | 11/1988 | Shiiki et al. |
| 5,218,030 | A | * | 6/1993 | Katayose et al. ............ 524/371 |
| 5,272,377 | A | | 12/1993 | Shimozawa et al. |
| 5,355,016 | A | | 10/1994 | Swirbel et al. |
| 5,998,876 | A | | 12/1999 | Carter et al. |
| 6,617,398 | B2 | * | 9/2003 | Yeager et al. ................ 525/391 |
| 7,067,595 | B2 | * | 6/2006 | Zarnoch et al. ............. 525/391 |
| 7,101,923 | B2 | * | 9/2006 | Campbell et al. ............ 524/133 |
| 7,148,296 | B2 | * | 12/2006 | Zarnoch et al. ............. 525/534 |
| 2003/0053782 | A1 | * | 3/2003 | Fabian et al. ................ 385/128 |
| 2003/0096123 | A1 | | 5/2003 | Yeager |
| 2004/0082730 | A1 | * | 4/2004 | Japp et al. .................. 525/391 |
| 2006/0041086 | A1 | * | 2/2006 | Birsak et al. ................ 525/391 |

FOREIGN PATENT DOCUMENTS

| WO | WO 01/40354 | 6/2001 |
| WO | WO 03/072628 | 9/2003 |
| WO | WO 2005/033179 | 4/2005 |
| WO | WO 2005/035661 | 4/2005 |

OTHER PUBLICATIONS

Handbook of Fillers, 2nd Edition edited by Wypych, Chapter 6, Chem-Tec Publishing, 1999.*

* cited by examiner

*Primary Examiner*—Marc S. Zimmer
(74) *Attorney, Agent, or Firm*—Shawn A. McClintic; William E. Powell, III

(57) ABSTRACT

An encapsulant for encapsulating electronic components and a method of making and/or using the encapsulant may be provided. An electronic device that includes the encapsulant may be provided. The curable encapsulant composition may include a mixture of a functionalized polymer and at least one reactive monomer composition. The reactive monomer composition may include a reactive monomer component that may be a low temperature solid and may be present in an amount in the reactive monomer composition a range of greater than about 20 weight percent based on the total weight of reactive monomer composition. The mixture, at about low temperature, may be solid or tack-free, or both solid and tack-free.

2 Claims, 2 Drawing Sheets

CURABLE ENCAPSULANT COMPOSITION, DEVICE INCLUDING SAME, AND ASSOCIATED METHOD

CROSS REFERENCE TO RELATED APPLICATIONS

This patent application is a continuation-in-part patent application of U.S. patent application Ser. No. 11/022,904 filed Dec. 22, 2004, the entire contents of which is hereby incorporated by reference.

BACKGROUND

1. Technical Field

The invention may include embodiments that relate to an encapsulant for encapsulating electronic components. The invention may include embodiments that relate to a method of making and/or using the encapsulant. The invention may include embodiments that relate to an electronic device that includes the encapsulant.

2. Discussion of Related Art

Electronic components, such as integrated circuits, may be encapsulated by transfer molding for environmental protection and to maintain structural and functional integrity. The encapsulating material may be a polymeric composition. Such encapsulating materials may be useful for encapsulation of semiconductors, semiconductor integrated circuits, passives, passive networks, multichip modules, opto-electronic devices and numerous other applications.

During molding, currently available encapsulating materials may stick to process equipment, or may be otherwise problematic. At room temperature, the encapsulating materials may be liquid or semi-solid putties.

U.S. Pat. Nos. 4,632,798; 4,632,798; 5,355,016; 5,998,876; and 5,272,377 address one or more encapsulant issues and disclose materials related thereto. International Publication No. WO 03/072628 A1 discloses a novolac type phenolic epoxy resin composition for encapsulating electronic parts.

It may be desirable to have an encapsulating material with different properties than encapsulants that are currently available. It may be desirable to have a cured encapsulant produced with materials and/or methods different from those materials and/or methods currently available. It may be desirable to have an electronic device that includes an encapsulant produced with materials and/or methods different from those materials and/or methods currently available.

BRIEF DESCRIPTION

In one embodiment, a curable encapsulant composition may be provided. The composition may include a mixture of a functionalized polymer and at least one reactive monomer composition. At least one reactive monomer or reactive monomer component of the reactive monomer composition may be a room temperature solid and may be present in the reactive monomer composition an amount in a range of greater than about 20 weight percent based on the total weight of the reactive monomer composition. The encapsulant, at low temperature, may be solid or tack-free, or both solid and tack-free.

In one embodiment, an electronic device may be provided. The electronic device may include an encapsulated circuit or die. The encapsulating composition may include a mixture of a functionalized polymer and a reactive monomer composition. At least one reactive monomer in the reactive monomer composition may be a room temperature solid and may be present in an amount in a range of greater than about 20 weight percent based on the total weight of reactive monomer composition. The mixture may be solid and/or tack-free at low temperature.

In one embodiment, a method of making an encapsulant may be provided. The method may include mixing a functionalized polymer with a reactive monomer composition. The reactive monomer composition may include a reactive monomer that is a low temperature solid and that is present in the reactive monomer composition an amount in a range of greater than about 20 weight percent based on the total weight of reactive monomer composition. The functionalized polymer and the reactive monomer composition may be heated to a temperature sufficient to soften or liquefy, and the functionalized polymer and the reactive monomer composition may be mixed with each other. The softened or liquid mixture may be cooled to form an encapsulant composition that is solid and/or tack-free at low temperature.

In another embodiment, a method of encapsulating at least a portion of the electronic or optical device may be provided. The method may include melting at least a portion of pellets or powder, in which the portion may include a mixture of a functionalized polymer and the reactive monomer composition. The reactive monomer composition may include a reactive monomer that may be a low temperature solid, and which is present in the reactive monomer composition in an amount in a range of greater than about 20 weight percent based on the total weight of reactive monomer composition. The pellets or powder, at room temperature, may be solid and/or tack-free. The molten portion may be flowed into contact with the portion of the electronic or optical device.

DETAILED DESCRIPTION

Figure 1:
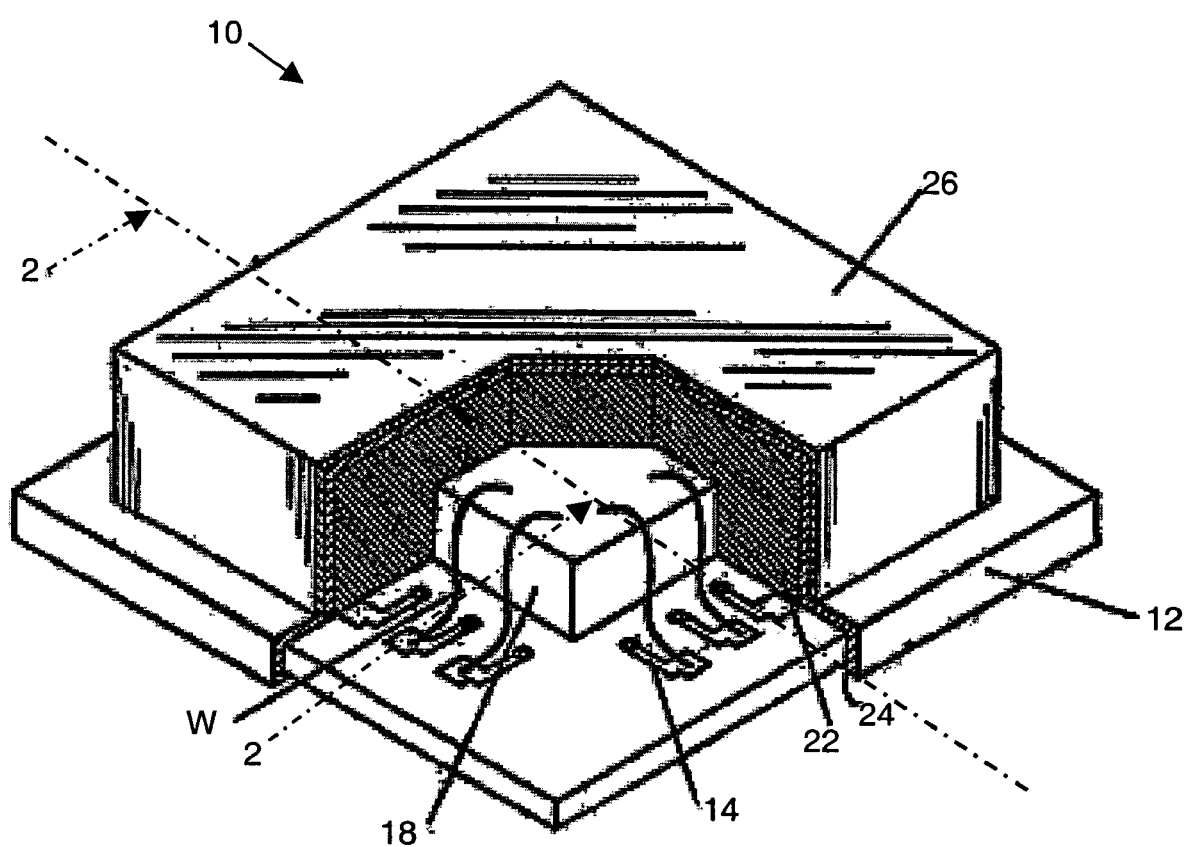
FIG. 1 is a perspective, cut-away view of an electronic assembly in accordance with an embodiment of the invention.

The invention may include embodiments that relate to an encapsulant for encapsulating electronic components. The invention may include embodiments that relate to a method of making and/or using the encapsulant. The invention may include embodiments that relate to an electronic device that includes the encapsulant.

Approximating language, as used herein throughout the specification and claims, may be applied to modify any quantitative representation that could permissibly vary without resulting in a change in the basic function to which it is related. Accordingly, a value modified by a term or terms, such as "about", is not to be limited to the precise value specified, and may include values that differ insubstantially from the specified value. In at least some instances, the approximating language may correspond to the precision of an instrument for measuring the value. Tack free may refer to a surface that does not possess pressure sensitive adhesive properties at about room temperature. By one measure, a tack free surface will not adhere or stick to a finger placed lightly in contact therewith at about 25 degrees Celsius, the temperature may be different using other specified measures.

Abbreviations may have the meanings indicated in Table 1.

TABLE 1

| Abbreviations. | |
|---|---|
| ADEP | aluminum diethylphosphinate |
| BPA | bisphenol A dimethacrylate |
| BVM | bis[[4-[(vinyloxy)methyl]cyclohexyl]methyl]terephthalate |
| CPAE | capped poly(arylene ether) |
| C | Centigrade |
| cm | Centimeter |
| CDD | Cyclohexane dimethanol diacrylate |
| EMI | electro-magnetic interference |
| EMMI | Epoxy Molding Materials Institute |
| E2BPA | Ethoxylated (2) bisphenol A dimethacrylate |
| 4-BiPh | 4-biphenyl methacrylate |
| MPa | megaPascal |
| MPP | melamine polyphosphate |
| MACPDMPE | Methacrylate capped poly(2,6-dimethyl phenylene ether) |
| mm | Millimeter |
| No. | Number |
| 1,6-HDD | 1,6-hexanediol diacrylate |
| 1,5-NP | 1,5-dimethacryloyl naphthalene |
| ppm | parts per million |
| PPE | polyphenylene ether |
| RFI | radio frequency interference |
| Rpm | Rotations per minute |
| SEMI | Semiconductor Equipment and Materials Institute |
| SMA | styrene maleic anhydride |
| TBC | t-butyl catechol |
| TBPB | t-butyl peroxybenzoate |
| TMBPA | tetramethyl bisphenol A dimethacrylate |
| TMBiPh | tetramethyl biphenol dimethacrylate |

In a first aspect, a curable encapsulant composition is disclosed. The composition may include a mixture of a functionalized polymer and a reactive monomer composition. The reactive monomer composition may include a reactive monomer that may be a room temperature solid and that may be present in the reactive monomer composition an amount in a range of greater than about 20 weight percent based on the total weight of reactive monomer composition. The mixture, at about low temperature, may be solid or tack-free, or both solid and tack-free.

Suitable functionalized polymers may include one or more novolac resin, polycarbonate, polyester, olefin polymer, or poly(arylene ether).

In one aspect, a suitable functionalized polymer may be produced by capping the hydroxyl radicals of novolac resins with (meth)acrylates. A portion of the hydroxyl groups may be capped with (meth)acrylates, while the remaining hydroxyl groups may be capped with alkyl groups or other radicals that do not participate in polymerization.

Suitable novolacs may be made by condensation of phenols (such as phenol, cresol, resorcin, catechol, bisphenol A, bisphenol F, phenylphenol, or dihydroxynaphthalene) with an aldehyde (such as formaldehdye, benzaldehyde, or salicylaldehyde) in the presence of an acid catalyst. Novolacs that may be made by condensation of phenols and formalin (aqueous formaldehyde) may be sold under the trademark SHONOL® by Showa Hipolymer Co., Ltd. (Tokyo, Japan). Suitable novolacs may be those that may have two or more phenolic hydroxyl groups, and may include, but may be not limited to, phenolic novolac, cresol novolac (such as methacrylated O-cresol novolac), t-butyl phenolic novolac, nonyl phenolic novolac, aralkyl type of phenol novolac {such as phenol aralkyl novolac or napthol aralkyl novolac synthesized from phenols and/or napthols and for instance, dimethoxyparaxylene or bis(methoxymethol)biphenyl}, dicyclopentadiene phenolic novolac, or combinations of two or more thereof.

Suitable functionalized polycarbonate may include bisphenol A polycarbonate having at least one methacryloyloxy group. In one embodiment, the functionalized polycarbonate may include hydroxyl-terminated bisphenol A polycarbonate which has been further reacted with methacryloyl chloride.

Suitable functionalized polyesters may include poly(ethylene teraphthalate) (PET) having a terminal acryloyloxy group. In one embodiment, functionalized polyesters may be prepared from corresponding hydroxyl-terminated polyesters.

Suitable functionalized olefin polymers may include polystyrene having at least one methacryloyloxy group. In one embodiment, functionalized olefin polymers may be prepared from the corresponding hydroxyl-terminated olefin polymers.

Suitable functionalized poly(arylene ether) may include one or more of a capped poly(arylene ether), a ring-functionalized poly(arylene ether), or an acid- or anhydride-functionalized poly(arylene ether), or a combination of these poly(arylene ether)s.

A capped poly(arylene ether) may have more than about 50 percent of the free hydroxyl groups functionalized by reaction with a capping agent, relative to the number of corresponding uncapped poly(arylene ether). In on embodiment, the percentage of capped hydroxyls may be in a range of from about 50 percent to about 75 percent, from about 75 percent to about 90 percent, from about 90 percent to about 95 percent, or from about 95 percent to about 99 percent.

A suitable capped poly(arylene ether) may include methacrylate-capped poly(2,6-dimethyl phenylene ether) (abbreviated herein as MACPDMPE), or may be represented by the structure $$Q(J-K)_y,$$

wherein Q may be the residuum of a monohydric, dihydric, or polyhydric phenol, preferably the residuum of a monohydric phenol or a dihydric phenol; y may be from 1 to about 100; J may include repeating structural units having the formula

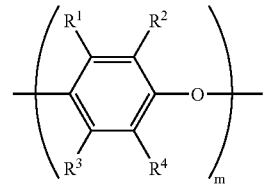

wherein m may be 1 to about 200, and $R^1$ and $R^3$ may be each independently hydrogen, halogen, primary or secondary $C_1$-$C_{12}$ alkyl, $C_2$-$C_{12}$ alkenyl, $C_2$-$C_{12}$ alkynyl, $C_1$-$C_{12}$ aminoalkyl, $C_1$-$C_{12}$ hydroxyalkyl, phenyl, $C_1$-$C_{12}$ haloalkyl, $C_1$-$C_{12}$ hydrocarbyloxy, $C_2$-$C_{12}$ halohydrocarbyloxy wherein at least two carbon atoms may be disposed between the halogen and oxygen atoms, or the like; $R^2$ and $R^4$ may be each independently halogen, primary or secondary $C_1$-$C_{12}$ alkyl, $C_2$-$C_{12}$ alkenyl, $C_2$-$C_{12}$ alkynyl, $C_1$-$C_{12}$ aminoalkyl, $C_1$-$C_{12}$ hydroxyalkyl, phenyl, $C_1$-$C_{12}$ haloalkyl, $C_1$-$C_{12}$ hydrocarbyloxy, $C_2$-$C_{12}$ halohydrocarbyloxy wherein at least two carbon atoms separate the halogen and oxygen atoms, or the like; and K may be a capping group produced by reaction of a phenolic hydroxyl group on the poly(arylene ether) with a capping agent. The resulting capping group, K, may be

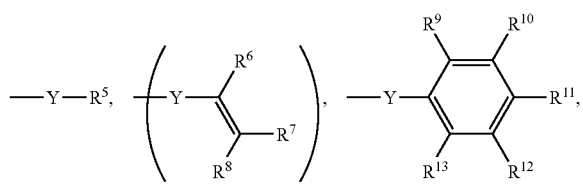

or the like, wherein $R^5$ may be $C_1$-$C_{12}$ hydrocarbyl optionally substituted with one or two carboxylic acid groups, or the like; $R^6$-$R^8$ may be each independently hydrogen, $C_1$-$C_{18}$ hydrocarbyl optionally substituted with one or two carboxylic acid groups, $C_2$-$C_{18}$ hydrocarbyloxycarbonyl, nitrile, formyl, carboxylic acid, imidate, thiocarboxylic acid, or the like; $R^9$-$R^{13}$ may be each independently hydrogen, halogen, $C_1$-$C_{12}$ alkyl, hydroxy, amino, carboxylic acid, or the like; and wherein Y may be a divalent group such as

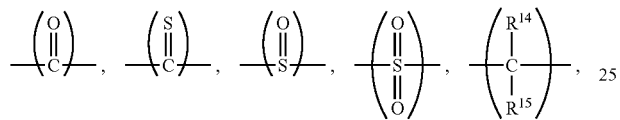

or the like, wherein $R^{14}$ and $R^{15}$ may be each independently hydrogen, $C_1$-$C_{12}$ alkyl, or the like.

Hydrocarbyl refers to a residue that contains only carbon and hydrogen, except where otherwise indicated. The residue may be aliphatic or aromatic, straight-chain, cyclic, bicyclic, branched, saturated, or unsaturated. The hydrocarbyl residue may contain heteroatoms over and above the carbon and hydrogen members of the substituent residue. The hydrocarbyl residue may contain carbonyl groups, amino groups, hydroxyl groups, carboxylic acid groups, halogen atoms, or the like, or it may contain heteroatoms within the backbone of the hydrocarbyl residue.

In one embodiment, Q may be the residuum of a phenol, including polyfunctional phenols, and may include radicals of the structure

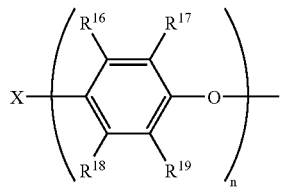

wherein $R^{16}$ through $R^{19}$ may be each independently hydrogen, halogen, primary or secondary $C_1$-$C_{12}$ alkyl, $C_2$-$C_{12}$ alkenyl, $C_2$-$C_{12}$ alkynyl, $C_1$-$C_{12}$ aminoalkyl, $C_1$-$C_{12}$ hydroxyalkyl, phenyl, $C_1$-$C_{12}$ haloalkyl, $C_1$-$C_{12}$ hydrocarbyloxy, $C_2$-$C_{12}$ halohydrocarbyloxy wherein at least two carbon atoms separate the halogen and oxygen atoms, or the like; $R^2$ and $R^4$ may be each independently halogen, primary or secondary $C_1$-$C_{12}$ alkyl, $C_2$-$C_{12}$ alkenyl, $C_2$-$C_{12}$ alkynyl, $C_1$-$C_{12}$ aminoalkyl, $C_1$-$C_{12}$ hydroxyalkyl, phenyl, $C_1$-$C_{12}$ haloalkyl, $C_1$-$C_{12}$ hydrocarbyloxy, $C_2$-$C_{12}$ halohydrocarbyloxy wherein at least two carbon atoms separate the halogen and oxygen atoms, or the like; X may be hydrogen, $C_1$-$C_{18}$ hydrocarbyl, or $C_1$-$C_{18}$ hydrocarbyl containing a substituent such as carboxylic acid, aldehyde, alcohol, amino radicals, or the like; X also may be sulfur, sulfonyl, sulfuryl, oxygen, or other such bridging group having a valence of 2 or greater to result in various bis- or higher polyphenols; n (i.e., the number of phenylene ether units bound to X) may be 1 to about 100, preferably 1 to 3, and more preferably 1 to 2. Q may be the residuum of a monohydric phenol, such as 2,6-dimethylphenol, in which case n may be 1. Q may also be the residuum of a diphenol, such as 2,2',6,6'-tetramethyl-4,4'-diphenol, in which case n may be 2.

In one embodiment, the uncapped poly(arylene ether) may be defined by reference to the capped poly(arylene ether) Q(J-K), as Q(J-H)y, where Q, J and y are defined above. But, a hydrogen atom, H, has taken the place of capping group K. In one embodiment, the uncapped poly(arylene ether) consists essentially of the polymerization product of at least one monohydric phenol having the structure

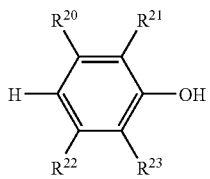

wherein $R^{20}$ through $R^{23}$ may be each independently hydrogen, halogen, primary or secondary $C_1$-$C_{12}$ alkyl, $C_2$-$C_{12}$ alkenyl, $C_2$-$C_{12}$ alkynyl, $C_1$-$C_{12}$ aminoalkyl, $C_1$-$C_{12}$ hydroxyalkyl, phenyl, $C_1$-$C_{12}$ haloalkyl, $C_1$-$C_{12}$ hydrocarbyloxy, $C_2$-$C_{12}$ halohydrocarbyloxy wherein at least two carbon atoms separate the halogen and oxygen atoms, or the like. In one embodiment, the monohydric phenol may include, for example, 2,6-dimethylphenol, 2,3,6-trimethylphenol, and the like.

The poly(arylene ether) may be a copolymer of at least two monohydric phenols. The uncapped poly(arylene ether) may include poly(2,6-dimethyl-1,4-phenylene ether), poly(2,6-dimethyl-1,4-phenylene ether-co-2,3,6-trimethyl-1,4-phenylene ether), or a mixture of two or more thereof. The uncapped poly(arylene ether) may be isolated by precipitation and may have a concentration of organic impurities in a range of from about 400 parts per million to about 300 parts per million, or less than about 300 parts per million. Organic impurities may include, for example, 2,3-dihydrobenzofuran, 2,4,6-trimethylanisole, 2,6-dimethylcyclohexanone, 7-methyl-2,3-dihydrobenzofuran, and the like.

In one embodiment, the capped poly(arylene ether) may include at least one capping group having the structure

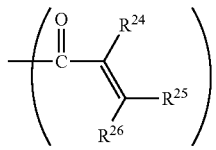

wherein $R^{24}$ through $R^{26}$ may be each independently hydrogen, $C_1$-$C_{18}$ hydrocarbyl optionally substituted with one or two carboxylic acid groups, $C_2$-$C_{18}$ hydrocarbyloxycarbonyl, nitrile, formyl, carboxylic acid, imidate, thiocarboxylic acid, or the like. Other suitable capping groups may include acrylate (where $R^{24}$ through $R^{26}$ are hydrogen) and methacrylate (where $R^{24}$ is methyl, and $R^{25}$ and $R^{26}$ are hydrogen). Acrylate may refer to one or both of acrylate or methacrylate.

In another embodiment, the capped poly(arylene ether) may include at least one capping group having the structure

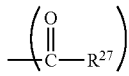

wherein $R^{27}$ may be $C_1$-$C_{12}$ hydrocarbyl substituted with one or two carboxylic acid groups, such as $C_1$-$C_6$ alkyl.

In yet another embodiment, the capped poly(arylene ether) may include at least one capping group having the structure

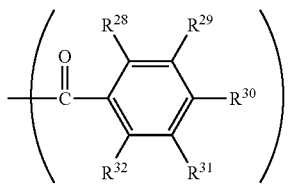

wherein $R^{28}$ through $R^{32}$ may be each independently hydrogen, halogen, $C_1$-$C_{12}$ alkyl, hydroxy, amino, carboxylic acid, or the like. Capping groups of this type may include salicylate (where $R^{29}$ through $R^{32}$ are hydrogen, and $R^{28}$ is hydroxy).

In one embodiment, the capped poly(arylene ether) may include at least one capping group having the structure

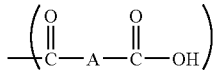

wherein A may be a saturated or unsaturated $C_2$-$C_{12}$ divalent hydrocarbon group such as, for example, ethylene; 1,2-propylene; 1,3-propylene; 2-methyl-1,3-propylene; 2,2-dimethyl-1,3-propylene; 1,2-butylene; 1,3-butylene; 1,4-butylene; 2-methyl-1,4-butylene; 2,2-dimethyl-1,4-butylene; 2,3-dimethyl-1,4-butylene; vinylene (—CH═CH—); 1,2-phenylene; and the like. These capped poly(arylene ether) resins may be prepared, for example, by reacting an uncapped poly(arylene ether) with a cyclic anhydride capping agent. Such cyclic anhydride capping agents may include, for example, maleic anhydride, succinic anhydride, glutaric anhydride, adipic anhydride, phthalic anhydride, and the like.

Other suitable capping agents may include compounds reactive with phenolic groups. Such compounds may include both monomers and polymers containing, for example, anhydride, acid chloride, epoxy, carbonate, ester, isocyanate, cyanate ester, or alkyl halide radicals. Phosphorus and sulfur based capping agents also may be may included. Examples of capping agents may include, for example, acetic anhydride, succinic anhydride, maleic anhydride, salicylic anhydride, polyesters comprising salicylate units, homopolyesters of salicylic acid, acrylic anhydride, methacrylic anhydride, glycidyl acrylate, glycidyl methacrylate, acetyl chloride, benzoyl chloride, diphenyl carbonates such as di(4-nitrophenyl)carbonate, acryloyl esters, methacryloyl esters, acetyl esters, phenylisocyanate, 3-isopropenyl-α,α-dimethylphenylisocyanate, cyanatobenzene, 2,2-bis(4-cyanatophenyl)propane, 3-(α-chloromethyl)styrene, 4-(α-chloromethyl)styrene, allyl bromide, and the like, and substituted derivatives thereof, and mixtures thereof.

In various embodiments, a suitable functionalized polymer may be prepared by reacting a single poly(arylene ether) with two or more functionalizing agents that differ from each other. For example, a poly(arylene ether) may be reacted with two capping agents that differ from each other, three capping agents that differ from each other, or more than three differing capping agents. In another example, a poly(arylene ether) may be metallized and reacted with two differing unsaturated alkylating agents. In another embodiment, a mixture of at least two poly(arylene ether) resins having different monomer compositions and/or molecular weights may be reacted with a single functionalizing agent. The composition may, optionally, comprise a blend of a functionalized poly(arylene ether) resin and an unfunctionalized poly(arylene ether) resin, and these two components may have different intrinsic viscosities. In various embodiments, the functionalized poly(arylene ether) may include one or both of poly(2,6-dimethyl-1,4-phenylene ether), or the copolymer of 2,6-dimethyl phenol and 2,3,6-trimethylphenol. In one embodiment, the functionalized poly(arylene ether) may consist essentially of poly(2,6-dimethyl-1,4-phenylene ether). In one embodiment, the functionalized poly(arylene ether) may consist essentially of the copolymer of 2,6-dimethyl phenol and 2,3,6-trimethylphenol.

A capping catalyst may facilitate the reaction of an uncapped poly(arylene ether) with an capping agent. Examples of such capping catalysts may include those capable of catalyzing condensation of phenols with the capping agents. In various embodiments, the capping catalyst may be a basic compound, which may include one or more hydroxide salts such as sodium hydroxide, potassium hydroxide, tetraalkylammonium hydroxides, and the like; tertiary alkylamines such as tributylamine, triethylamine, dimethylbenzylamine, dimethylbutylamine and the like; tertiary mixed alkyl-arylamines and substituted derivatives thereof such as N,N-dimethylaniline; heterocyclic amines such as imidazoles, pyridines, and substituted derivatives thereof such as 2-methylimidazole, 2-vinylimidazole, 4-dimethylaminopyridine, 4-(1-pyrrolino)pyridine, 4-(1-piperidino)pyridine, 2-vinylpyridine, 3-vinylpyridine, 4-vinylpyridine, and the like. Also useful may be organometallic salts such as, for example, tin and zinc salts operable to catalyze the condensation of, for example, isocyanates or cyanate esters with phenols.

A suitable ring-functionalized poly(arylene ether) may include a poly(arylene ether) comprising repeating structural units of the formula

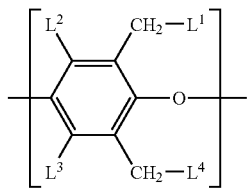

wherein each $L^1$-$L^4$ may be independently hydrogen, a $C_1$-$C_{12}$ alkyl group, an alkenyl group, or an alkynyl group; wherein the alkenyl group may be represented by

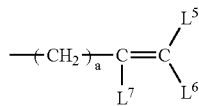

wherein $L^5$-$L^7$ may be independently hydrogen or methyl, and a may be 0, 1, 2, 3, or 4; wherein the alkynyl group may be represented by

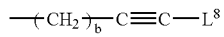

wherein $L^8$ may be hydrogen, methyl, or ethyl, and b may be 0, 1, 2, 3, or 4; and wherein from about 0.02 mole percent to about 25 mole percent of the total $L^1$-$L^4$ substituents in the ring-functionalized poly(arylene ether) may be alkenyl groups and/or alkynyl groups. In various embodiments, the substituents may be present in an amount in a range of from about 0.02 mole percent to about 0.1 mole percent, from about 0.1 mole percent to about 0.5 mole percent, from about 0.5 mole percent to about 10 mole percent, from about 10 mole percent to about 15 mole percent, or from about 15 mole percent to about 25 mole percent of alkenyl and/or alkynyl groups.

The ring-functionalized poly(arylene ether) may be prepared by taking an unfunctionalized poly(arylene ether), such as poly(2,6-dimethyl-1,4-phenylene ether), and metallizing with a reagent such as n-butyl lithium. Subsequently, the metallized material may be reacted with an alkenyl halide such as allyl bromide and/or an alkynyl halide such as propargyl bromide.

Suitable acid functionalized poly(arylene ether) or anhydride functionalized poly(arylene ether) may include the product of the melt reaction of a poly(arylene ether) and an α,β-unsaturated carbonyl compound or a β-hydroxy carbonyl compound to produce an acid- or anhydride-functionalized poly(arylene ether). In various embodiments, either or both acid and anhydride functionality may be present. Examples of α,β-unsaturated carbonyl compounds may include one or more of fumaric acid, maleic acid, maleic anhydride, itaconic acid, itaconic anhydride, citraconic acid, citraconic anhydride, as well as derivatives of the foregoing, and similar compounds. Examples of β-hydroxy carbonyl compounds may include, for example, citric acid, malic acid, and the like. Such functionalization may be carried out by melt mixing the poly(arylene ether) with the desired carbonyl compound at a temperature in a range of from about 150 degrees Celsius to about 300 degrees Celsius.

The functionalized polymer may have a glass transition temperature (Tg) greater than about 24 degrees Celsius, and may include functional groups capable of reacting with the reactive monomer in the reactive monomer composition. Suitable functional groups may include one or more alkeneyl group, allyl group, vinyl group, acrylate group, methacrylate group, vinyl ether group, vinyl ketone group, and cinnamyl group. In various embodiments, the functional groups may include one or both of methacryloyloxy and acryloyloxy.

The composition may include a functionalized poly(arylene ether) having a number average molecular weight in a range of from about 1,000 to about 25,000 atomic mass units (AMU). In various embodiments, the functionalized poly(arylene ether) may have a number average molecular weight of in a range of from about 1,000 AMU to about 2,000 AMU, from about 2,000 AMU to about 4,000 AMU, or from about 4,000 AMU to about 100,000 AMU.

The functionalized poly(arylene ether) may have an intrinsic viscosity of about 0.05 deciliters per gram to about 0.6 deciliters per gram as measured in chloroform at 25 degrees Celsius. In various embodiments, the functionalized poly(arylene ether) intrinsic viscosity may be in a range of from about 0.05 to about 0.08 deciliters per gram, from about 0.08 deciliters per gram to about 0.1 deciliters per gram, from about 0.1 deciliters per gram to about 0.3 deciliters per gram, from about 0.3 deciliters per gram to about 0.4 deciliters per gram, from about 0.4 deciliters per gram to about 0.5 deciliters per gram, or from about 0.5 deciliters per gram to about 10 deciliters per gram, as measured in chloroform at 25 degrees Celsius. In another embodiment, the functionalized poly(arylene ether) intrinsic viscosity may be in a range of less than or equal to about 0.15 deciliters per gram, in a range of from about 0.15 deciliters per gram to about 0.25 deciliters per gram, or from about 0.25 deciliters per gram to about 10 deciliters per gram as measured in chloroform at 25 degrees Celsius. A mixture of functionalized polymers having differing intrinsic viscosities may be employed. In various embodiments, MACPDMPE may have an intrinsic viscosity that may be in a range of from about 0.12 deciliters per gram to about 0.2 deciliters per gram, in a range of from about 0.2 deciliters per gram to about 0.25 deciliters per gram, from about 0.25 deciliters per gram to about 0.3 deciliters per gram, or from about 0.3 deciliters per gram to about 10 deciliters per gram. In one embodiment, this mixture may include about 50 percent by weight of MACPDMPE having an intrinsic viscosity of about 0.12 and about 50 percent by weight of MACPDMPE having an intrinsic viscosity of about 0.30.

Selection of a relatively lower intrinsic viscosity may increase flow properties during transfer molding of the composition. Selection of a relatively higher intrinsic viscosity material may increase a temperature threshold at which a composition may remain tack-free. Controlling amounts of materials, and the selection of corresponding intrinsic viscosities of those materials, may allow control over flow properties and temperature threshold of an encapsulant composition.

In one embodiment, the intrinsic viscosity of a functionalized poly(arylene ether) may be within about 10 percent of that of the unfunctionalized poly(arylene ether). Blends of at least two functionalized poly(arylene ether)s may be used having relatively different molecular weights, intrinsic viscosities, or both. Such blends may be prepared from individually prepared and isolated functionalized poly(arylene ethers).

Suitable reactive monomers for use in the reactive monomer composition may be crystalline and may exhibit a melting point at a low temperature. In one embodiment, the melt point may be in a range of greater than about 24 degrees Celsius. In various embodiments, the reactive monomer for use in the reactive monomer composition may be crystalline and may exhibit a melting point in a range of from less than 24 degrees Celsius to about 30 degrees Celsius, from about 30 degrees Celsius to about 40 degrees Celsius, from about 40 degrees Celsius to about 50 degrees Celsius, from about 50 degrees Celsius to about 60 degrees Celsius, or from about 60 degrees Celsius to about 100 degrees Celsius.

In one embodiment, reactive monomer composition may include a plurality of differing reactive monomers, provided that greater than about 20 weight percent of the reactive monomer in the reactive monomer composition is a low temperature solid. In other embodiments, the weight percentage of reactive monomer present in the reactive monomer composition that is a low temperature solid is in a range of about greater than 20 weight percent based on the total weight of reactive monomer composition.

In various embodiments, the reactive monomer may be present in a range of from about 10 weight percent to about 20 weight percent, in a range of from about 20 weight percent to about 30 weight percent, from about 30 weight percent to about 40 weight percent, from about 40 weight percent to about 50 weight percent, from about 50 weight percent to about 60 weight percent, from about 60 weight percent to about 70 weight percent, from about 70 weight percent to about 80 weight percent, based on the total weight of reactive monomer composition in the total encapsulant composition according to an embodiment of the invention.

The reactive monomer composition may be solid at a low temperature. A low temperature may be less than about room temperature, room temperature, or in a temperature range of from about room temperature up to about 100 degrees Celsius in one embodiment. In other embodiments, low temperature may include a temperature in a range of from about 25 degrees Celsius to about 35 degrees Celsius, from about 35 degrees Celsius to about 50 degrees Celsius, or from about 50 degrees Celsius to about 100 degrees Celsius. A reactive monomer that is solid at, for example, 35 degrees Celsius would also be a solid at the lower 25 degrees Celsius (about room temperature). Thus, such higher melting point or softening point reactive monomer compositions are included in the category of low temperature solids, but ingredient proportions and ratios may be adjusted and determined based on application specific criteria.

In one embodiment, the reactive monomer composition may include triallyloxytriazine, which may be used alone or in combination with one or more other reactive monomers in the reactive monomer composition. Other suitable reactive monomers may include acrylates and/or methacrylates. In various embodiments, reactive monomer composition may include one or more reactive monomer having a moiety selected from allyl ester, allyl cyanurate, allyl isocyanurate, vinyl benzene, vinyl ether, vinyl ester, acrylate, methacrylate, or a combination of two or more thereof. In various embodiments, the reactive monomer composition may include one or more of:

bis[[4-[(vinyloxy)methyl]cyclohexyl]methyl]terephthalate (BVM), which may be sold by Morflex Inc. under the name VECTOMER® 4051, a trademark registered to Allied Signal Inc;
biphenol dimethacrylate;
bisphenol A dimethacrylate (BPA);
bisphenol diacrylate;
4-biphenyl methacrylate (4-BiPh);
cyclohexane dimethanol diacrylate, which may be available from Sartomer Technology Company, Inc. (Wilmington, Del.), under the trademark SARTOMER® CD 406;
1,5-dimethacryloyl naphthalene (1,5-NP);
ethoxylated (2) bisphenol A dimethacrylate (E2BPA);
sulfonyldiphenol dimethacrylate;
tetramethyl bisphenol A dimethacrylate (TMBPA);
tetramethyl biphenol dimethacrylate (TMBiPh);
and the like; and combinations of two or more thereof.

Each reactive monomer in the reactive monomer composition may have a melting point or softening point temperature associated therewith. A softening point indicates a temperature range limit for compositions have a melting "point" that spans a temperature range, thus the softening point may refer to the lowest temperature in a melting point temperature range. For example, a commercially available cyclohexane dimethanol diacrylate may have a melting temperature in a range of from about 77 degrees Celsius to about 78 degrees Celsius. 4-Biphenyl methacrylate also may be known as 4-methacryloyloxy biphenyl, and may have a melting temperature of about 105 degrees Celsius to 108 degrees Celsius. Bisphenol A dimethacrylate may have a melting temperature of about 65 degrees Celsius to 71 degrees Celsius. Trimethacrylate of tris(4-hydroxyphenyl) ethane, also known as tetramethyl bisphenol A dimethacrylate may have a melting temperature of about 126 degrees Celsius to about 135 degrees Celsius. Biphenol dimethacrylate may have a melting temperature of about 145 degrees Celsius to about 148 degrees Celsius. Tetramethyl biphenol dimethacrylate may have a melting temperature of about 160 degrees Celsius to about 170 degrees Celsius. Sulfonyldiphenol dimethacrylate may have a melting temperature of about 147 degrees Celsius to about 151 degrees Celsius. 1,5-Dimethacryloyl naphthalene may have a melting temperature of about 97 degrees Celsius to about 100 degrees Celsius.

During cure, a reactive monomer composition with an acrylate and/or methacrylate functional reactive monomer may react with itself and/or with functional groups of the functionalized polymer. Reaction may take place during heating, in the presence of a curative, an initiator, or the like. The reactive monomer composition may be supplied with an inhibitor, such as hydroquinone, to provide stability to the reactive monomer composition until it may be subjected to heating in the presence of an initiator.

In various embodiments, based on the combined weight of the functionalized polymer and the reactive monomer composition, a composition according to an embodiment of the invention may include an amount of a functionalized polymer in a range of from about 5 weight percent to about 10 weight percent, from about 10 weight percent to about 30 weight percent, from about 30 to about 45 weight percent, from about 45 weight percent to about 55 weight percent, from about 55 weight percent to about 70 weight percent, or from about 70 weight percent to about 80 weight percent. In various embodiments, the amount of functionalized polymer may be greater than 80 weight percent, in a range of from about 80 weight percent to about 90 weight percent, or greater than about 90 weight percent, relative to the total amount of resin that includes the reactive monomer composition and the functionalized polymer. In various embodiments, the amount of reactive monomer composition may be greater than about 10 weight percent, in a range of from about 10 weight percent to about 20 weight percent, from about 20 weight percent to about 30 weight percent, from about 30 weight percent to about 40 weight percent, from about 40 weight percent to about 50 weight percent, from about 50 weight percent to about 60 weight percent, from about 60 weight percent to about 70 weight percent, from about 70 weight percent to about 80 weight percent, or greater than about 80 weight percent, relative to the total amount of resin that includes the reactive monomer composition and the functionalized polymer.

Relative to the total weight of an encapsulating composition, the functionalized polymer may be present in an amount greater than about 1 weight percent, or greater than about 10 weight percent. In various embodiments, the functionalized polymer may be present in an amount in a range of from about 1 weight percent to about 1.5 weight percent, from about 1.5 weight percent to about 3.5 weight percent, from about 3.5 weight percent to about 6 weight percent, from about 6 weight percent to about 7 weight percent, from about 7 weight percent to about 10 weight percent, from about 10 weight percent to about 20 weight percent, or from about 20 weight percent to about 80 weight percent, relative to the entire composition based on all the components.

In one embodiment, a tack-free composition may include functionalized poly(arylene ether) in an amount greater than about 5 parts by weight per 100 parts by weight total of the functionalized poly(arylene ether) and the reactive monomer composition. Particularly, the amount of the functionalized poly(arylene ether) resin may be less than about 5 parts, in a range of from about 5 parts to about 10 parts, from about 10 parts to about 20 parts, from about 20 parts to about 50 parts, from about 50 parts to about 60 parts, from about 60 parts to about 80 parts, or from about 80 parts to about 90 parts, based on the total weight of the functionalized poly (arylene ether) and the reactive monomer composition.

The tack-free composition may include one or more polymerization inhibitors. In various embodiments, the tack-free composition may include about 0.01 weight percent to about 0.05 weight percent, from about 0.05 weight percent to about 0.2 weight percent, from about 0.2 weight percent to about 0.3 weight percent, from about 0.3 weight percent to about 0.5 weight percent, or from about 0.5 weight percent to about 5 weight percent of a polymerization inhibitor based on total weight.

The polymerization inhibitor may be originally present in one or more of the reactive monomers in the reactive monomer composition, as supplied by a commercial vendor. Alternatively or additionally, a polymerization inhibitor may be added to the reactive monomer composition. Suitable polymerization inhibitors may include one or more phenolics, for example catechol, and $C_1$ to $C_4$ alkyl catechols such as methyl catechol, ethyl catechol, propyl catechol, isopropyl catechol, butyl catechol, t-butyl catechol. In some instances, mixtures of $C_1$ to $C_4$ alkyl catechols may be employed. Other suitable polymerization inhibitors may include t-butyl catechol, hindered amines and the like.

The polymerization inhibitor may be present in an amount in a range of greater than about 0.02 weight percent based on total weight. In various embodiments, the polymerization inhibitor may be present in an amount in a range of from about 0.02 weight percent to about 0.04 weight percent, from about 0.04 weight percent to about 0.06 weight percent, from about 0.06 weight percent to about 0.15 weight percent, or from about 0.15 weight percent to about 5 weight percent, relative to the entire composition based on all components. The composition may include an amount of polymerization inhibitor in a range of from about 0.01 weight percent to about 0.05 weight percent, from about 0.05 weight percent to about 0.2 weight percent to about weight percent, from about 0.2 weight percent to about 0.3 weight percent, or from about 0.3 weight percent to about 5 weight percent, relative to the amount of reactive monomer composition.

The curing agent may be present in an amount in a range of greater than about 0.2 weight percent based on total weight. In various embodiments, the curing agent may be present in an amount in a range of from about 0.2 to about 0.3 weight percent, from about 0.3 weight percent to about 0.4 weight percent, from about 0.4 weight percent to about 1 weight percent, or from about 1 weight percent to about 5 weight percent, relative to the entire composition based on all components.

Suitable curing agents may include, but may be not limited to, azo compounds, organic peroxides, or combinations of two or more thereof. Suitable azo compounds may include, but may be not limited to, azobisisobutyronitrile. Suitable organic peroxides may include, but may be not limited to, dicumyl peroxide, t-butyl peroxy benzoate, or combinations of two or more thereof. When the curing agent may be an organic peroxide curing agent, a partial cure time in a range of from about 80 to about 100 seconds. The partial cure time may be determined with a Dynamic Cure Monitor (an apparatus that measures the cure profile using a dielectric spectrometer built into a heated platen press). The partial cure time may be increased by the presence of the polymerization inhibitor.

The mold release agent is optional, but may be present in an amount in a range of greater than about 0.2 weight percent based on total weight. In various embodiments, the mold release agent may be present in an amount in a range of from about 0.2 to about 0.3 weight percent, from about 0.3 weight percent to about 0.4 weight percent, from about 0.4 weight percent to about 0.6 weight percent, or from about 0.6 weight percent to about 5 weight percent, relative to the entire composition based on all components.

Suitable mold release agents may include, but may be not limited to, stearic acids, metal salts of stearic acids, montanic acids, esters of fatty acids, such as carnauba wax, or combinations of two or more thereof. A suitable metal salt of a stearic acid may be zinc stearate. A suitable montanic acid mold release agent may be a partly saponified esterified montanic acid that may be a wax sold by Clariant under the trademark LICOWAX® OP.

The colorant is optional, but may be present in an amount in a range of greater than about 0.1 weight percent based on total weight. In various embodiments, the colorant may be present in an amount in a range of from about 0.1 to about 0.2 weight percent, from about 0.2 to about 0.4 weight percent, from about 0.4 to about 1 weight percent, or from about 1 weight percent to about 5 weight percent, relative to the entire composition based on all components.

Suitable colorants may include, but may be not limited to, carbon black. A commercially available carbon black is obtainable from Printex under the trade name XE2.

The flame retardant is optional, but may be present in an amount in a range of greater than about 0.5 weight percent based on total weight. In various embodiments, the flame retardant may be present in an amount in a range of from about 0.5 to about 0.8 weight percent, from about 0.8 to about 1.7 weight percent, from about 1.7 weight percent to about 5 weight percent, or from about 5 weight percent to about 50 weight percent, relative to the entire composition based on all components.

Suitable flame retardants may include, but may be not limited to, melamine polyphosphate (sold by Ciba Specialty Chemicals under the trademark MELAPUR® 200), aluminum diethyl phosphinate (sold by Clariant under the trade name OP 930), mixture of melamine polyphosphate and aluminum diethylphosphinate (sold by Clariant under the trade name OP 1311), or combinations of two or more thereof. Additional suitable flame retardants may include melamine pyrophosphate, antimony trioxide, antimony pentoxide, alumina trihydrate, magnesium hydroxide, and the like. Additionally suitable organic flame retardants may include halogenated aromatic compounds (e.g. dibromostyrene and polymers thereof, tetrabromobisphenol A and polymers thereof), and the like.

If present, the optional adhesion promoter present in an amount in a range of greater than about 0.7 weight percent, or less than about 1.5 weight percent based on total weight. In various embodiments, the adhesion promoter present in an amount in a range of from about 0.7 to about 1.3 weight percent, or from about 1.3 to about 1.5 weight percent, relative to the entire composition based on all components.

Suitable adhesion promoters may include, but may not be limited to, styrene maleic anhydride, zinc acrylate (sold by Sartomer), partially acrylated bisphenol A epoxy (sold by Surface Specialties under the trademark EBECRYL® 3605), mixture of bisphenol A epoxy and diaminodiphenylmethane, or combinations of two or more thereof. In one embodiment, the encapsulant may be essentially free of a tackifier.

The reinforcing filler is optional, but may be present in amount in a range of greater than about 1 weight percent based on total weight. In various embodiments, reinforcing filler may be present in amount in a range of from about 1 weight percent to about 40 weight percent, from about 40 weight percent to about 60 weight percent, from about 60 weight percent to about 86 weight percent, from about 86 weight percent to about 92 weight percent, or from about 92 weight percent to about 99 weight percent, relative to of the entire composition based on all components.

Suitable fillers may include, but are not limited to, one or more of alumina, zinc oxide, silica (e.g. fused silica, fumed silica, colloidal silica, and the like) alumina, boron nitride, titania, titanium dioxide, titanium diboride, talc, fly ash, calcium carbonate, carbon black, or graphite, and the like.

The filler may include particles having one or more morphologies and physical dimensions. In various embodiments, the reinforcing filler may include one or more of spherical particles, semi-spherical particles, spheroids, oblates, amorphous particles, hollow spheres, porous materials, and the like. In various embodiments, the reinforcing filler may include rods, whiskers, geometric shapes, tubes, and/or fibers that may have at least one dimension (length, width or breadth) that is longer than another dimension. The filler may have a mean or average dimension distribution that is less than or equal to about 75 micrometers, less than or equal to about 50 micrometers, less than or equal to about 35 micrometers, less than or equal to about 25 micrometers, or the dimension may be sub-micrometer. The reinforcing filler may include particles having a bimodal particle size distribution, or a trimodal particle size distribution, or a higher modality particle size distribution. In various embodiments, the reinforcing filler may include particles having a bimodal particle size distribution and essentially all of the particles present are spherical Suitable silica may include fused silica. The fused silica may be treated, for example, with a silane-coupling agent. Suitable coupling agents may include an alcohol solution of gamma-methacryloxypropyl trimethoxy silane coupling agent (Z-6030 from Dow Corning). The treatment may include have the coupling agent catalyzed with a small amount of water and acetic acid, and being sprayed onto silica (FB 570 silica and SFP 30M silica in a 90:10 ratio), leaving silanol groups, followed by heating at about 95 degrees Celsius, to condense the silanol groups. FB 570 silica and SFP 30M silica may be sold by Denki Kagaku Kogyo Kabushiki Kaisha, doing business as Denka Group (Tokyo, Japan).

Another suitable silica may include colloidal silica. The colloidal silica may have an average diameter that is about micrometer scale, or less. In various embodiments, the colloidal silica may have an average diameter that is nanoscale, for example, less than about 5 nanometers, in a range of from about 5 nanometers to about 10 nanometers, from about 10 to about 20 nanometers, from about 20 nanometers to about 40 nanometers, or from about 40 nanometers to about 500 nanometers. The colloidal silica may be spherical, semi-spherical, amorphous, or geometric shaped. Treating of the colloidal silica may be with an alkoxysilane material or the like. In one embodiment, suitable treatment may increase compatibility of the otherwise hydrophilic silica with an at least somewhat non-polar organic phase matrix. Because the treatment may leave residual active termination sites on the silica (e.g., silanol) that may reduce stability, a subsequent or second treatment of the silica may be performed with a capping or passivating agent. Suitable passivating agents may include a silizane, such as hexamethyl disilizane. This two-part treatment may leave an insubstantial or no active termination sites available on the silica that may reduce stability or shelf life, or undesirably increase viscosity or initiate crosslinking over time.

Other optional additives may be included in the composition. Suitable other additives may include one or more functionalized liquid rubber, micronized rubber, metal adhesion promoter, soldermask adhesion promoter, ion exchange additive, antioxidant, polymerization accelerator, or resin hardener, and the like.

The composition may include a functionalized polymer and a reactive monomer composition, where more than about 20 weight percent of the reactive filler is a room temperature solid relative to the total weight of reactive filler. Additionally, the composition may include an initiator or curing agent, and filler. The composition may include further one or more of a polymerization inhibitor, a mold release agent, a colorant, a flame retardant, or an adhesion promoter. In one embodiment the functionalized polymer, the reactive monomer composition, and the polymerization inhibitor may be admixed while heating to form a molten liquid, to which may be added optional ingredients. In one embodiment, a mixture of a CPAE, a reactive monomer composition, an initiator, and a polymerization inhibitor may be heated and admixed to form a molten liquid. The liquid may be cooled and crystallized to provide a friable composition. The friable composition may be compounded with filler.

The compositions may be employed in a transfer molding process. In one embodiment, the composition may be formed into a pellet. Pellets may be used in a transfer molding process, for example, as the encapsulant of an electronic device such as a circuit. Pellets may be readily formed by conventional techniques such as compression of the composition in a mold at ambient temperature.

The transfer molding apparatus may include a pot, which may be a cylindrical cavity fitted with a retractable plunger. The composition of the invention in pellet form and the pot may have approximately the same diameter. The pot may be kept hot, at the same temperature as the molding tool. After the pellet has been inserted into the pot, the plunger presses the pellet through an opening at the bottom of the pot into the hot runner system of the molding tool. Cycle time may be in a range of from about 1 minute to about 4 minutes.

The pot and the molding tool may be independently held at temperatures that are greater than about 50 degrees Celsius, in a range of from about 50 degrees Celsius to about 100 degrees Celsius, from about 100 degrees Celsius to about 130 degrees Celsius, from about 130 degrees Celsius to about 140 degrees Celsius, or from about 140 degrees Celsius to about 175 degrees Celsius, or greater than about 175 degrees Celsius. Temperatures higher than about 150 degrees Celsius may be useful with, for example, lead-free solder applications.

Pellets under about 7 grams may be softened within a few seconds by inserting the pellet into the transfer pot. Large pellets (over about 7 grams) may be pre-heated, for example, using a radio frequency pre-heater with an infrared pyrometer, and then inserted into the transfer pot.

A low softening temperature for the pellet may inhibit the composition from flowing out of the pot before the pellet has softened. For example, the pellet may deform or sinter to other pellets. The softened pellets may glom to each other, and/or the sides of the container, and may not pour as free-flowing pellets. A softening temperature too high may undesirably cure the pellets prior to use.

Transfer-molding suitability may correlate to a spiral flow length. Spiral flow length may be measured by SEMI G11-88 recommended practice for ram follower gel time, and for spiral flow of thermal setting molding compounds, or by EMMI 1-66. Spiral flow length may be measured at about 1 MPa and about 150 degrees Celsius. In various embodiments, the spiral flow length of the compositions may be greater than about 11 inches, in a range of from about 11 inches to about 30 inches, from about 30 inches to about 50 inches, from about 50 inches to about 61 inches, or from about 61 inches to about 100 inches.

The spiral flow length may be controlled by selection of, for example, reactive diluent type and amount. Alternatively or additionally, the spiral flow length may be increased by the presence of the polymerization inhibitor, and may be decreased by the presence of filler, colorant, and/or flame retardant. The spiral flow length may be decreased by using more of the CPAE, particularly MACPDMPE. Also, when using a mixture of 0.12 intrinsic viscosity MACPDMPE and 0.30 intrinsic viscosity MACPDMPE, increasing the relative amount of 0.12 intrinsic viscosity MACPDMPE in the mix may increase the spiral flow length. In one embodiment, an encapsulant may exhibit a high flow rate (measured as a relatively long spiral flow length) and low viscosity in a temperature range of from about 125 degrees Celsius to about 175 degrees Celsius.

A cured encapsulant may exhibit a hardness in a range of from about 20 Shore D to about 30 Shore D, from about 30 Shore D to about 50 Shore D, from about 50 Shore D to about 60 Shore D, or greater than about 60 Shore D. A suitable molding compositions may exhibit, after curing, a flex strength in a range of from about 65 MPa to about 70 MPa, from about 70 MPa to about 150 MPa, from about 150 MPa to about 160 MPa, or from about 160 MPa to about 200 MPa.

With reference to the Shore D hardness values, a durometer (e.g., a Zwick Durometer Hardness Tester) may be used to determine the relative hardness of soft materials, usually plastic or rubber in accordance with ASTM D2240. The durometer measures the penetration of a specified indentor into material under specified conditions of force and time. The testing procedure may include the following steps. The specimen may be first placed on a hard flat surface. The indentor for the instrument may be pressed into the specimen making sure that it is parallel to the surface. The hardness may be read within one second of firm contact with the specimen. The test specimens may be 6.4 mm (¼ in) thick.

Figure 2:
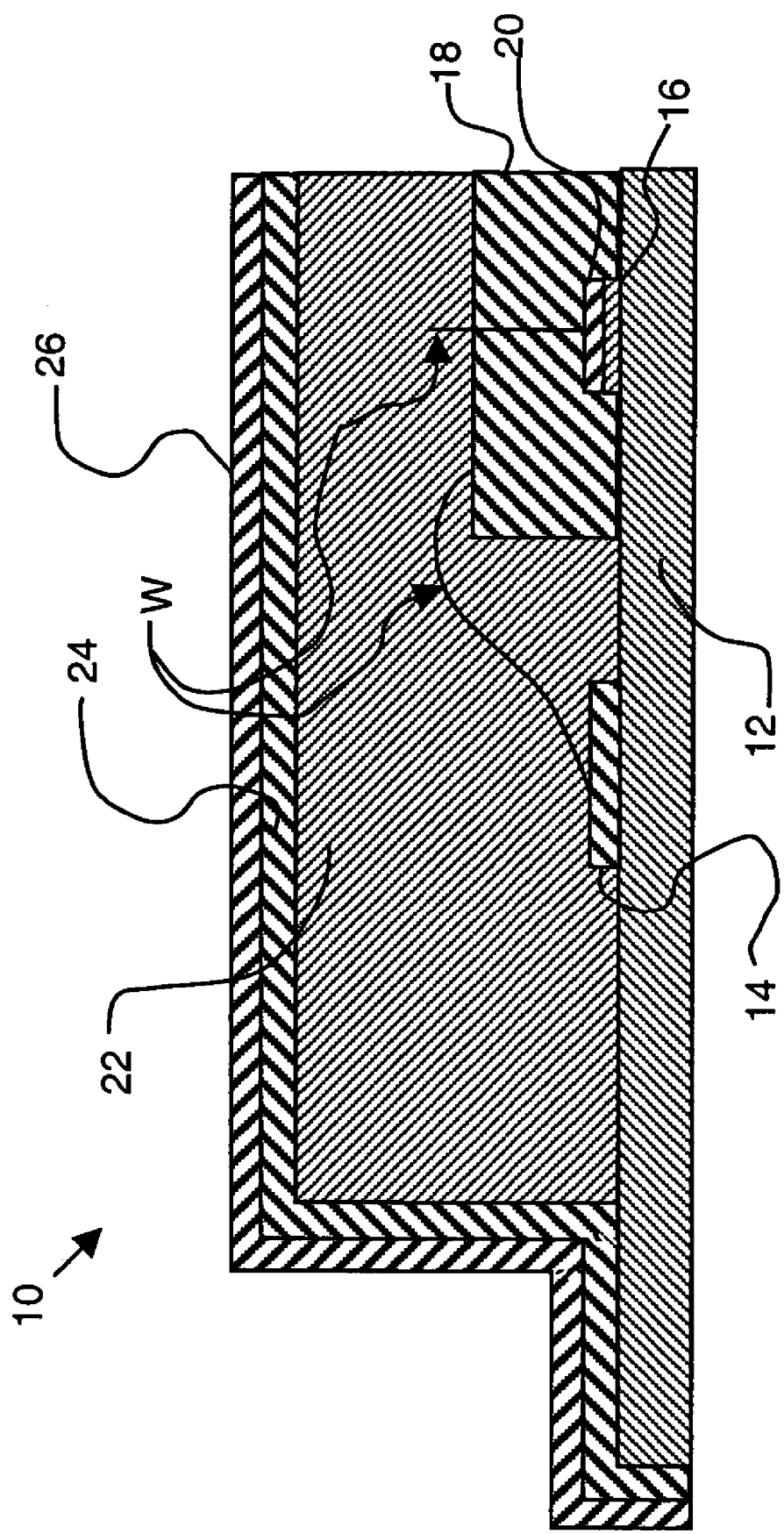
FIG. 2 is a cross-sectional view of the electronic assembly, taken through section 2-2 of FIG. 1.

In FIGS. 1 and 2, like reference numerals refer to like elements throughout. It may be noted that the various features shown may be not to scale. The following may be illustrative, and may not be limiting.

An electronic assembly 10 is shown in FIG. 1, and a cross-sectional view of the electronic assembly 10 that may be taken through section 2-2 of FIG. 1 is shown in FIG. 2.

The electronic assembly 10 may include a substrate 12. The substrate 12 may be any of a number of materials commonly used in the electronics industry, including, but not limited to, polymer, glass, metal, and/or ceramic, and may be flexible or rigid. The substrate 12 may be a printed circuit board, an epoxy circuit card, or a copper lead frame.

The substrate 12 may be a carrier for a metallization pattern which may include an interconnection pad 14 and a mounting area 16 (FIG. 2), on which an electronic component 18 may be mounted, for instance, by an adhesive 20 (FIG. 2). The electronic component 18 may be soldered to the mounting area 16.

Representative electronic components 18, may be encapsulated and may include one or more transistors, capacitors, relays, diodes, resistors, networks of resistors, integrated circuits, and the like. The electronic component 18 may be connected with the wires W to the various pads 14. The wires W may be metal wires, and may include, gold, aluminum, or both.

The electronic component 18 and the wires W are encapsulated with the polymeric composition 22. The thickness of the polymeric composition 22 may be in a range of from about 0.1 millimeters (mm) to about 0.5 mm, from about 0.5 mm to about 3 mm, from about 3 mm to about 3.5 mm, or greater than about 3.5 mm.

The polymeric composition 22 may be applied by transfer molding. The assembly 10 of the substrate 12 with the electronic component 18 may be placed in a transfer molding machine (not shown) having a mold (not shown). The polymeric composition 22 may be preheated and inserted into a pot, and then forced from a pot into the hot mold cavity. The polymeric composition 22 may flow and mold around the electronic component 18 and the associated wires W, and around at least portions of the pads 14, the mounting areas 16, and the substrate 12. Upon solidification, the molded part may be ejected from the mold.

EXAMPLES

The following examples are intended only to illustrate methods and embodiments in accordance with the invention, and as such should not be construed as imposing limitations upon the claims. Unless specified otherwise, all ingredients are commercially available from such common chemical suppliers as Alpha Aesar, Inc. (Ward Hill, Mass.), Spectrum Chemical Mfg. Corp. (Gardena, Calif.), and the like.

Examples 1-10

Preparation of Unfilled Compositions

Examples 1-10 include a functionalized polymer (such as a capped polyarylene ether (CPAE)), a room temperature solid reactive monomer composition (that is, having a melting or softening point above room temperature), an initiator, and reinforcing filler. Examples 1-10 are prepared and evaluated as described herein.

The capped polyarylene ether (CPAE) is a methacrylate-capped poly(2,6-dimethyl phenylene ether) (MACPDMPE) having an intrinsic viscosity of about 0.12 or about 0.30 depending on the example. A 50/50 mixture of 0.12 intrinsic viscosity MACPDMPE and 0.30 intrinsic viscosity MACPDMPE is used in Examples 1 and 2.

In Examples 1-10, cyclohexane dimethanol diacrylate (sold by Sartomer under the trademark SARTOMER® CD 406) is employed, optionally together with one or more other reactive monomer compositions. For example, mixtures of cyclohexane dimethanol diacrylate (CDD) and ethoxylated (2) bisphenol A dimethacrylate (sold by EBAM under the trade name SR-348, abbreviated herein as E2BPA) or 1,6-hexanediol diacrylate (sold by EBAM under the trade name SR-248, abbreviated here as 1,6-HDD) are employed.

A polymerization inhibitor, t-butyl catechol (abbreviated herein as TBC), is included in the composition at a concentration of approximately 1000 ppm to reduce a risk of premature polymerization of the composition.

The ingredients and amounts of the compositions of Examples 1-10 are summarized in Table 2. Amounts are reported in parts by weight percent of the total composition. Intrinsic viscosity is reported in deciliters per gram.

TABLE 2

Ingredients and amounts of Examples 1-10.

| | Functional Polymer | | Reactive monomer composition | | | |
|---|---|---|---|---|---|---|
| No. | MACPDMPE | Intrinsic viscosity | CDD | E2BPA | 1,6-HDD | Inhibitor TBC |
| 1 | 20 | 50% 0.12 50% 0.30 | 80 | 0 | 0 | 0.1 |
| 2 | 20 | 50% 0.12 50% 0.30 | 60 | 0 | 20 | 0.1 |
| 3 | 20 | 0.12 | 80 | 0 | 0 | 0.1 |
| 4 | 20 | 0.12 | 60 | 0 | 20 | 0.1 |
| 5 | 15 | 0.30 | 85 | 0 | 0 | 0.1 |
| 6 | 20 | 0.30 | 80 | 0 | 0 | 0.1 |
| 7 | 25 | 0.30 | 75 | 0 | 0 | 0.1 |
| 8 | 20 | 0.30 | 60 | 20 | 0 | 0.1 |
| 9 | 20 | 0.30 | 40 | 40 | 0 | 0.1 |
| 10 | 20 | 0.30 | 60 | 0 | 20 | 0.1 |

Compositions are prepared by blending the components under vigorous stirring in a container for about 15 minutes at about 170 degrees Celsius on a hot plate until a clear liquid formed. The hot liquid is quenched by pouring the contents of the container into a shallow aluminum pan at room temperature. Within minutes, crystalline spherulites form and grow in the quenched composition.

The quenched composition in each of Examples 1-10 is a tack-free, friable hard solid. Tack is determined by the finger touch test at room temperature, and at 35 degrees Celsius. To be considered tack-free for this instance, the Examples 1-10 need only be tack-free at room temperature. Each of the Examples 1-10 was tack-free at both room temperature and at about 35 degrees Celsius. Friability is determined by striking a portion of the solid composition with a hammer and observing the formation of a powder having discrete particles. Pellets formed from the material of each of Examples 1-10 were relatively free flowing at least up to a temperature of about 5 degrees Celsius. Further, the pellets each had a softening point or melt point that is in a temperature range of from about 50 degrees Celsius to about 150 degrees Celsius.

Example 11

Preparation of Encapsulant

The composition of Example 3, above, is combined with fused silica. The silica is a mixture of the silicas FB 570 and SFP 30M treated with gamma-methacryloxy propyl trimethoxy silane. The silica filled combination is admixed with a curing agent, mold release agent, colorant, and flame retardant. The curing agent is dicumyl peroxide. The mold release agent is CERIDUST® (CLARIANT). The colorant is a mixture of green and red colorants: SANDOPLAST® Red G and SANDOPLAST® Green GSB (CLARIANT). The flame retardant is aluminum diethylphosphinate (OP 930, CLARIANT).

The admixing is performed in a BRABENDER mixing bowl fitted with roller mixing blades and operating at about 80 rpm. The bowl temperature is maintained at about 80 degrees Celsius. The mixing time is about 5 minutes. The ingredients and amounts of the resulting filled composition are summarized in Table 3.

Comparative Examples 1-4 and Examples 12-24

TABLE 3

Ingredients and amounts (in grams and weight %) of materials used in Example 11.

| INGREDIENTS | GRAMS | WEIGHT % |
|---|---|---|
| MACPDMPE | 13.28 | 2.45 |
| CDD | 53.14 | 9.8 |
| TBC | 0.27 | 0.05 |
| fused silica | 462.24 | 85.3 |
| dicumyl peroxide | 1.62 | 0.3 |
| mold release agent | 2.16 | 0.4 |
| red/green colorant blend | 1.08 | 0.2 |
| ADEP | 8.1 | 1.5 |
| TOTAL | 541.89 | 100 |

The compositions of Comparative Examples 1-4 and Examples 12-24 are prepared as described below.

Comparative Examples 1 and 2 do not have a room temperature solid reactive monomer composition content. The reactive monomer composition used in Comparative Examples 1 and 2 (E2BPA) is a liquid at about room temperature; has a relatively high degree of tack, or tackiness, prior to cure; contributes to a relatively low spiral flow length; and, when cured, contributes to a relatively low hardness (Shore D). Comparative Examples 3 and 4 are filled systems that do not include functionalized polymer content. The reactive monomer composition used in Comparative Examples 3 and 4 is a monomeric biphenol epoxy resin, and the filler loading is greater than 75 percent by weight.

Examples 12-24 include both a functionalized polymer and a reactive monomer composition. The functionalized polymer includes methacrylate-capped poly(2,6-dimethyl phenylene) ether (MACPDMPE). The reactive monomer composition includes at least one reactive monomer composition that is a room temperature solid.

Comparative Examples 1-4 and Examples 12-14 and 17-24 include an adhesion promoter (SMA) and a flame retardant. All the Comparative examples and Examples 12-24 include a mold release agent (stearic acid), a polymerization inhibitor (t-butyl catechol), colorant, and a curing agent (t-butyl peroxy benzoate). The functionalized polymer (MACPDMPE) has an intrinsic viscosity of 0.30 or 0.12, as indicated in Table 4.

The reactive monomer composition includes reactive monomers selected from among ethoxylated (2) bisphenol A dimethacrylate (E2BPA); bisphenol A dimethacrylate (BPA); 1,5-dimethacryloyl naphthalene (1,5-NP); bis[[4-[(vinyloxy)methyl]cyclohexyl]methyl]terephthalate (BVM); tetramethyl bisphenol A dimethacrylate (TMBPA); tetramethyl biphenol dimethacrylate (TMBiPh); and 4-biphenyl methacrylate (4-BiPh) and mixtures thereof. Each of the compositions of Comparative Examples 1-2 and Examples 12-24 comprise t-butyl catechol as a polymerization inhibitor. With the exception of the compositions of Examples 15 and 16, an adhesion promoter that includes styrene maleic anhydride (SMA) is employed. The SMA enhances adhesion of the final composition to a substrate.

The functionalized polymer and reactive monomer composition are mixed in a 200-milliliter beaker that is immersed in a stirred, 4-liter oil bath at about 170 degrees Celsius. An overhead stirrer is used to agitate the contents of the beaker for about 15 minutes. Subsequently, the contents of the beaker are a transparent liquid. The beaker is removed from the oil bath, and allowed to cool on the bench, while being monitored with a glass thermometer until the temperature of the contents is about 100 degrees Celsius. After 100 degrees Celsius is achieved, the colorant and mold release agent are added with manual stirring, as well as any optional ingredients such as adhesion promoter. When the temperature had cooled to about 80 degrees Celsius, the curing agent is added with manual stirring.

The hot liquid is quenched by pouring the contents from the beaker into a shallow aluminum pan at room temperature. Within minutes, crystalline spherulites form and grow in the quenched composition. Approximately 80 grams of each composition are produced for each of Comparative Examples 1-2 and Examples 12-24. Approximately 71.2 grams of each composition is crushed into small pieces and compounded with a filler and a flame retardant as follows. Examples 15 and 16 receive no flame retardant.

The filler is a fused silica (a mixture of FB 570 and SFP 30M treated with gamma-methacryloxy propyl trimethoxy silane, as described above). The filler is mixed with the flame retardant OP 1311 (a mixture of melamine polyphosphate and aluminum diethylphosphinate, CLARIANT) in a Henschel mixer at room temperature. Next, the filler mixture is split into two approximately equal portions.

The first potion of the filler mixture is poured into a Brabender mixing bowl fitted with roller mixing blades operated at 80 rpm. The bowl temperature is about 80 degrees Celsius. Next, approximately 71.2 grams of the crushed mixture of the methacrylate-capped poly (2,6-dimethyl phenylene ether, reactive monomer composition, optional adhesion promoter (SMA), and t-butyl catechol ingredients is charged into the Brabender mixer, followed immediately by the second portion of the filler mixture. The total mixing time is about 5 minutes. The resulting filled composition has a mass of about 540 grams.

The ingredients used in Comparative Examples 1-2 and Examples 12-24 are summarized in Table 4.

TABLE 4

Ingredients and amounts of Comparative Examples 1-4 and Examples 12-24

| INGREDIENT | WEIGHT % |
|---|---|
| Functional Polymer (MACPDMPE)* | 1.71 |
| Reactive monomer composition | 9.67 |
| TBC | 0.06 |
| SMA** | 0.86 |
| Colorant | 0.10 |
| stearic acid | 0.40 |
| TBPB*** | 0.38 |
| fused silica | 85.6 |
| Flame retardant mixture** | 1.25 |
| TOTAL | 100 |

*Example 16, MACPDMPE with an intrinsic viscosity of 0.12 is employed, remainder are 0.30.
**Examples 15 and 16, there is no SMA and no flame retardant.
***Comparative Example 2, the amount of TBPB is greater than 0.38 percent.

The reactive monomer composition includes the combined weight of all the reactive monomers present, if more than one reactive monomer is present, in each sample. The weight percent amounts of each of the various reactive monomers, based on the total amount of reactive monomer composition, for the compositions of Comparative Examples 1-4 and Examples 12-24 are summarized in Table 5 below.

TABLE 5

Reactive monomer content in the reactive monomer composition.

Reactive monomer composition (weight percent amount)

| No. | E2BPA* | BPA | 1,5-NP | BVM | TMBPA | TMBiPh | 4-BiPh |
|---|---|---|---|---|---|---|---|
| CE-1 | 100 | 0 | 0 | 0 | 0 | 0 | 0 |
| CE-2 | 100 | 0 | 0 | 0 | 0 | 0 | 0 |
| CE-3 | 100 | 0 | 0 | 0 | 0 | 0 | 0 |
| CE-4 | 100 | 0 | 0 | 0 | 0 | 0 | 0 |
| 12 | 80 | 0 | 0 | 0 | 0 | 0 | 20 |
| 13 | 60 | 0 | 0 | 0 | 0 | 0 | 40 |
| 14 | 70 | 0 | 0 | 0 | 0 | 0 | 30 |
| 15 | 60 | 0 | 0 | 0 | 0 | 0 | 40 |
| 16 | 60 | 0 | 0 | 0 | 0 | 0 | 40 |
| 17 | 40 | 30 | 0 | 0 | 0 | 0 | 30 |
| 18 | 40 | 0 | 30 | 0 | 0 | 0 | 30 |
| 19 | 80 | 0 | 0 | 20 | 0 | 0 | 0 |
| 20 | 80 | 20 | 0 | 0 | 0 | 0 | 0 |
| 21 | 80 | 0 | 20 | 0 | 0 | 0 | 0 |
| 22 | 80 | 0 | 0 | 0 | 20 | 0 | 0 |
| 23 | 80 | 0 | 0 | 0 | 0 | 20 | 0 |
| 24 | 50 | 0 | 25 | 0 | 0 | 0 | 25 |

*E2BPA is a room temperature liquid.

Various properties of the compositions of Comparative Examples 1-4 and Examples 12-24 are measured and summarized in Table 6 below.

TABLE 6

Properties of Comparative Examples and Examples.

| No. | Spiral Flow (inches) | Hardness (Shore D) |
|---|---|---|
| CE-1 | 31 | 16 |
| CE-2 | 36 | not measured |
| CE-3 | >30 | >20 |
| CE-4 | >30 | >20 |
| 12 | 36 | 21 |
| 13 | 50 | 43 |
| 14 | 47 | 35 |
| 15 | 80 | not measured |
| 16 | 95 | not measured |
| 17 | 40.5 | 25 |

TABLE 6-continued

Properties of Comparative Examples and Examples.

| No. | Spiral Flow (inches) | Hardness (Shore D) |
|---|---|---|
| 18 | 17 | 32 |
| 19 | 31 | 17 |
| 20 | not measured | not measured |
| 21 | not measured | not measured |
| 22 | not measured | not measured |
| 23 | not measured | not measured |
| 24 | 39 | 38 |

Table 6. Properties of Comparative Examples and Examples.

In comparing the results shown in Table 6, a pellet at room temperature with a Shore D hardness of greater than about 20 Shore D is considered solid. As shown, Examples 13-14, 18, and 24 all have Shore D hardness values greater than 30. Accordingly, Examples 13-14, 18, and 24 are considered to be solid at about room temperature.

Thus, even though all of the samples have at least some material that is a room temperature liquid, at least some of the samples may be room temperature solids. Further, at least some of the Examples may be tack-free at room temperature.

Examples 25-30

Room Temperature Solid Reactive Monomer Compositions

Examples 25-30 demonstrate compositions in which all of the reactive monomer compositions used are room temperature solid materials. The compositions are prepared in the same manner as that described for Examples 12-24. The ingredients and amounts are listed in corresponding tables, below.

Example 25

TABLE 7

Ingredients and amounts for Example 25.

| Component | Chemical | Weight (g) |
|---|---|---|
| Filler | Treated Silica | 449.25 |
| Resin | BPA dimethacrylate | 35.53 |
| Resin | Biphenyl methacrylate (BPM) | 15.23 |
| Resin | 0.30 iv MACPDMPE | 8.98 |
| Inhibitor | 4-t-butyl catechol | 0.33 |
| Initiator | tert-Butyl perbenzoate (TBPB) | 1.99 |
| Adhesion Promoter | SMA | 4.51 |
| Dye | Keystone Green | 0.52 |
| Mold Release | Stearic acid | 2.10 |
| Flame Retardant | OP1311 | 6.56 |

Example 26

TABLE 8

Ingredients and amounts for Example 26.

| Component | Chemical | Weight (g) |
|---|---|---|
| Filler | Treated Silica | 495.64 |
| Resin | Bisphenol Z Dimethacrylate | 39.28 |
| Resin | Biphenyl methacrylate (BPM) | 16.83 |
| Resin | 0.12 iv bifunctional MACPDMPE | 9.90 |
| Inhibitor | 4-t-butyl catechol | 0.42 |
| Initiator | tert-Butyl perbenzoate (TBPB) | 2.20 |
| Adhesion Promoter | SMA | 4.97 |
| Pigment | Black Pearls | 1.74 |
| Mold Release | Stearic acid | 1.74 |
| Flame Retardant | OP1311 | 7.27 |

Example 27

TABLE 9

Ingredients and amounts for Example 27.

| Component | Chemical | Weight (g) |
|---|---|---|
| Filler | Treated Silica | 496.46 |
| Resin | Benzophenone dimethacrylate | 39.29 |
| Resin | Benzophenone methacrylate | 16.84 |
| Resin | 0.12 iv bifunctional MACPDMPE | 9.91 |
| Inhibitor | 4-t-butyl catechol | 0.63 |
| Initiator | tert-Butyl perbenzoate (TBPB) | 1.16 |
| Adhesion Promoter | SMA | 4.97 |
| Pigment | Black Pearls | 1.74 |
| Mold Release | Licowax S | 1.74 |
| Flame Retardant | OP1311 | 7.27 |

Example 28

TABLE 10

Ingredients and amounts for Example 28.

| Component | Chemical | Weight (g) |
|---|---|---|
| Filler | Treated Silica | 496.46 |
| Resin | Benzophenone dimethacrylate | 39.29 |
| Resin | Benzophenone methacrylate | 16.84 |
| Resin | 0.12 iv bifunctional MACPDMPE | 9.90 |
| Inhibitor | 4-t-butyl catechol | 0.63 |
| Initiator | tert-Butyl perbenzoate (TBPB) | 1.16 |
| Adhesion Promoter | SMA | 4.97 |
| Pigment | Black Pearls | 1.74 |
| Mold Release | Carnauba Wax | 1.74 |
| Flame Retardant | OP1311 | 7.27 |

Example 29

TABLE 11

Ingredients and amounts for Example 29.

| Component | Chemical | Weight (g) |
|---|---|---|
| Filler | Treated Silica | 495.67 |
| Resin | 3,3'-(Ethylenedioxy)diphenol Dimethacrylate | 39.27 |

TABLE 11-continued

Ingredients and amounts for Example 29.

| Component | Chemical | Weight (g) |
|---|---|---|
| Resin | Biphenyl methacrylate (BPM) | 16.83 |
| Resin | 0.12 iv bifunctional MACPDMPE | 9.90 |
| Inhibitor | 4-t-butyl catechol | 0.41 |
| Initiator | tert-Butyl perbenzoate (TBPB) | 2.21 |
| Adhesion Promoter | SMA | 4.97 |
| Pigment | Black Pearls | 1.74 |
| Mold Release | Carnauba Wax | 1.74 |
| Flame Retardant | OP1311 | 7.27 |

Example 30

Example 30 demonstrates the use of a glassy solid methacrylate in combination with a room temperature crystalline material. This formulation is prepared by mixing the following ingredients in the same manner as that described for Example 12-24

TABLE 12

Ingredients and amounts for Example 30.

| Component | Chemical | Weight (g) |
|---|---|---|
| Filler | Treated Silica | 495.38 |
| Resin | Partially Methacrylated Novolac Resin | 39.27 |
| Resin | Biphenyl methacrylate (BPM) | 16.83 |
| Resin | 0.12 iv bifunctional MACPDMPE | 9.90 |
| Inhibitor | 4-t-butyl catechol | 0.42 |
| Initiator | tert-Butyl perbenzoate (TBPB) | 2.21 |
| Adhesion Promoter | SMA | 4.97 |
| Pigment | Black Pearls | 1.74 |
| Mold Release | Carnauba Wax | 3.48 |
| Flame Retardant | OP1311 | 5.80 |

Examples 25-30 are pressed into pellets and their hardness is measured. They are also transfer molded at 150 degrees Celsius and their spiral flow values are measured. The recorded in Table 13.

TABLE 13

Hardness and Flow Values for Examples 25–30

| Example No. | Pellet Hardness (Shore D) | Spiral Flow (inches) |
|---|---|---|
| 25 | 52.7 | 45.2 |
| 26 | 68.1 | 37.0 |
| 27 | 66.2 | 45.2 |
| 28 | 70.9 | 41.3 |
| 29 | 62.9 | 48.8 |
| 30 | 74.8 | 24.0 |

A pellet at room temperature with a hardness of greater than about 20 Shore D may be considered solid. As shown, Examples 25-30 all have Shore D hardness values greater than 30, or greater than 50. Accordingly, the Examples 25-30 are solid at about room temperature.

The foregoing examples are merely illustrative, serving to illustrate only some of the features of the invention. The appended claims are intended to claim the invention as broadly as it has been conceived and the examples herein presented are illustrative of selected embodiments from a manifold of all possible embodiments. Accordingly it is Applicants' intention that the appended claims are not to be limited by the choice of examples utilized to illustrate features of the present invention. As used in the claims, the word "comprises" and its grammatical variants logically also subtend and include phrases of varying and differing extent such as for example, but not limited thereto, "consisting essentially of" and "consisting of." Where necessary, ranges have been supplied, those ranges are inclusive of all sub-ranges there between. It is to be expected that variations in these ranges will suggest themselves to a practitioner having ordinary skill in the art and where not already dedicated to the public, those variations should where possible be construed to be covered by the appended claims. It is also anticipated that advances in science and technology will make equivalents and substitutions possible that are not now contemplated by reason of the imprecision of language and these variations should also be construed where possible to be covered by the appended claims.

What is claimed is:

1. A method of encapsulating at least a portion of an electronic or optical device, comprising:

melting at least a portion of pellets or powder, the portion comprising a mixture of a functionalized polymer and a reactive monomer composition, the reactive monomer composition comprising at least one reactive monomer that is both a solid up to about 100 degrees Celsius and present in the reactive monomer composition in an amount in a range of greater than about 20 weight percent based on the total weight of the reactive monomer composition, and the pellets or powder being solid or tack-free, or both solid and tack-free at a temperature that is up to about 100 degrees Celsius; and flowing the molten portion into contact with the portion of the electronic or optical device.

2. The method as defined in claim 1, further comprising curing the molten portion to encapsulate the at least a portion of the electronic or optical device.

* * * * *